United States Patent
Baks et al.

(10) Patent No.: US 9,985,346 B2
(45) Date of Patent: May 29, 2018

(54) WIRELESS COMMUNICATIONS PACKAGE WITH INTEGRATED ANTENNAS AND AIR CAVITY

(71) Applicant: International Business Machines Corporation, Armonk, NY (US)

(72) Inventors: Christian Wilhelmus Baks, Poughkeepsie, NY (US); Xiaoxiong Gu, White Plains, NY (US); Duixian Liu, Scarsdale, NY (US); Alberto Valdes-Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/404,182

(22) Filed: Jan. 11, 2017

(65) Prior Publication Data

US 2017/0125895 A1    May 4, 2017

Related U.S. Application Data

(63) Continuation of application No. 14/663,702, filed on Mar. 20, 2015, now Pat. No. 9,620,464.

(Continued)

(51) Int. Cl.
*H01Q 1/22* (2006.01)
*H01Q 1/42* (2006.01)
(Continued)

(52) U.S. Cl.
CPC .............. *H01Q 1/42* (2013.01); *H01Q 1/2291* (2013.01); *H01Q 1/48* (2013.01); *H01Q 9/0457* (2013.01); *H01Q 13/10* (2013.01)

(58) Field of Classification Search
CPC .. H01Q 1/22; H01Q 1/42; H01Q 1/48; H01Q 9/0457; H01Q 13/10; H01L 23/66; H01L 23/49827
See application file for complete search history.

(56) References Cited

U.S. PATENT DOCUMENTS

| 4,835,538 A | 5/1989 | McKenna et al. |
| 6,594,893 B2 | 7/2003 | Bailey et al. |

(Continued)

FOREIGN PATENT DOCUMENTS

| CN | 101662076 A | 3/2010 |
| JP | 2003168920 A | 6/2003 |

OTHER PUBLICATIONS

T. Seki et al., "Millimeter-Wave High-Efficiency Multilayer Parasitic Microstrip Antenna Array on Teflon Substrate," IEEE Transactions on Microwave Theory and Techniques, Jun. 2005, pp. 2101-2106, vol. 53, No. 6.

(Continued)

*Primary Examiner* — Hoang Nguyen
(74) *Attorney, Agent, or Firm* — Vazken Alexanian; Ryan, Mason & Lewis, LLP

(57) ABSTRACT

Antenna package structures are provided to implement wireless communications packages. For example, an antenna package includes a package carrier and a package cover. The package carrier includes an antenna ground plane and an antenna feed line. The package cover includes a planar lid having a planar antenna element formed on a first surface of the planar lid. The package cover is bonded to a first surface of the package carrier with the first surface of the planar lid facing the first surface of the package carrier, and with the planar antenna element aligned to the antenna ground plane and the antenna feed line of the package carrier, wherein the first surface of the planar lid is disposed at a distance from the first surface of the package carrier to provide an air space between the planar antenna element and the package carrier.

20 Claims, 10 Drawing Sheets

Related U.S. Application Data

(60) Provisional application No. 62/037,002, filed on Aug. 13, 2014.

(51) Int. Cl.
*H01Q 1/48* (2006.01)
*H01Q 9/04* (2006.01)
*H01Q 13/10* (2006.01)

(56) References Cited

U.S. PATENT DOCUMENTS

| | | |
|---|---|---|
| 6,696,930 B1 | 2/2004 | Nahapetian et al. |
| 7,372,408 B2 | 5/2008 | Gaucher et al. |
| 7,518,221 B2 | 4/2009 | Gaucher et al. |
| 7,675,465 B2 | 3/2010 | Doan et al. |
| 8,269,671 B2 | 9/2012 | Chen et al. |
| 8,362,599 B2 | 1/2013 | Kim et al. |
| 8,648,454 B2 | 2/2014 | Liu et al. |
| 8,988,299 B2 | 3/2015 | Kam et al. |
| 9,196,951 B2 | 11/2015 | Baks et al. |
| 2006/0276157 A1 | 12/2006 | Chen et al. |
| 2008/0291115 A1 | 11/2008 | Doan et al. |
| 2009/0322643 A1 | 12/2009 | Choudhury |
| 2010/0190464 A1 | 7/2010 | Chen et al. |
| 2010/0327068 A1 | 12/2010 | Chen et al. |
| 2011/0285606 A1 | 11/2011 | De Graauw et al. |
| 2012/0075154 A1 | 3/2012 | Biglarbegian et al. |
| 2012/0212384 A1 | 8/2012 | Kam et al. |
| 2012/0235880 A1 | 9/2012 | Kim et al. |
| 2013/0099006 A1 | 4/2013 | Hong et al. |
| 2013/0141284 A1 | 6/2013 | Jeong |
| 2014/0145884 A1 | 5/2014 | Dang et al. |

OTHER PUBLICATIONS

List of IBM Patents or Patent Applications Treated as Related.

WIRELESS COMMUNICATIONS PACKAGE WITH INTEGRATED ANTENNAS AND AIR CAVITY

TECHNICAL FIELD

This disclosure generally relates to wireless communications package structures and, in particular, to techniques for packaging antenna structures with semiconductor RFIC (radio frequency integrated circuit) chips to form compact integrated radio/wireless communications systems for millimeter wave (mm Wave) applications.

BACKGROUND

When constructing wireless communications package structures with integrated antennas, it is important to implement package designs that provide proper antenna characteristics (e.g., high efficiency, wide bandwidth, good radiation characteristics, etc.), while providing low cost and reliable package solutions. The integration process requires the use of high-precision fabrication technologies so that fine features can be implemented in the package structure. Conventional solutions are typically implemented using complex and costly packaging technologies, which are lossy and/or utilize high dielectric constant materials. For consumer applications, high performance package designs with integrated antennas are not typically required. However, for industrial applications (e.g., 5G cell tower applications), high performance antenna packages are needed and typically require large phased arrays of antennas. The ability to design high performance packages with phased array antennas is not trivial for millimeter wave operating frequencies and higher. For example, conventional surface-wave suppressing methods in antenna designs cannot be used in phased array antenna packages as the additional structures used for suppressing surface waves occupy too much space, so there is no room to implement them. Moreover, other factors make it difficult and non-trivial to implement phased array antenna systems in a package environment

SUMMARY

Embodiments of the invention generally include antenna package structures and wireless communications package structures. For example, in one embodiment of the invention, an antenna package includes a package carrier and a package cover. The package carrier includes an antenna ground plane and an antenna feed line. The package cover includes a planar lid, wherein the planar lid includes a planar antenna element formed on a first surface of the planar lid. The package cover is bonded to a first surface of the package carrier with the first surface of the planar lid facing the first surface of the package carrier, and with the planar antenna element on the first surface of the planar lid aligned to the antenna ground plane and the antenna feed line of the package carrier. The package cover is bonded to the package carrier with the first surface of the planar lid fixedly disposed at a distance from the first surface of the package carrier to provide an air space between the planar antenna element and the first surface of the package carrier.

In another embodiment of the invention, a wireless communications package includes an antenna package, an RFIC chip, and an application board. The antenna package includes a package carrier and a package cover. The package carrier has a first surface and a second surface, and includes an antenna ground plane and a plurality of an antenna feed lines, and an array of bonding pads formed on the second surface. The package cover includes a planar lid having an array of planar antenna elements formed on a first surface of the planar lid. The package cover is bonded to the first surface of the package carrier with the first surface of the planar lid facing the first surface of the package carrier, and with the array of planar antenna elements on the first surface of the planar lid aligned to the antenna ground plane and to corresponding ones of the antenna feed lines of the package carrier. The package cover is bonded to the package carrier with the first surface of the planar lid fixedly disposed at a distance from the first surface of the package carrier to provide an air space between the array of planar antenna elements and the first surface of the package carrier. The RFIC chip is flip-chip bonded to bonding pads on the second surface of the package carrier, and the application board is bonded to bonding pads on the second surface of the package carrier.

These and other embodiments of invention will be described or become apparent from the following detailed description of embodiments, which is to be read in connection with the accompanying drawings.

BRIEF DESCRIPTION OF THE DRAWINGS

FIGS. 1A and 1B schematically illustrate a wireless communications package according to an embodiment of the invention, wherein FIG. 1A is a schematic cross-sectional side view of the wireless communications package, and wherein FIG. 1B is a schematic plan view of an antenna package cover according to an embodiment of the invention as viewed in the direction indicated by line 1B-1B in FIG. 1A.

FIGS. 4A and 4B schematically illustrate an antenna package cover according to another embodiment of the invention, which comprises structures to prevent warpage or sagging of the antenna package cover, wherein FIG. 4A is a schematic plan view of the antenna package cover, and wherein FIG. 4B is a schematic side view of the antenna package cover along line 4B-4B of FIG. 4A.

DETAILED DESCRIPTION

Embodiments of the invention will now be discussed in further detail with regard to wireless communications package structures and, in particular, to techniques for packaging antenna structures with semiconductor RFIC chips to form compact integrated radio/wireless communications systems for millimeter wave applications. As discussed in further detail below, embodiments of the invention include antenna package structures having integrated antenna systems with embedded air cavities, which are designed to implement wireless communications packages having high-performance antennas (e.g., phased array antenna) with very good radiation characteristics. It is to be understood that the various layers and/or components shown in the accompanying drawings are not drawn to scale, and that one or more layers and/or components of a type commonly used in constructing wireless communications packages with integrated antenna structure and RFIC chips may not be explicitly shown in a given drawing. This does not imply that the layers and/or components not explicitly shown are omitted from the actual package structures. Moreover, the same or similar reference numbers used throughout the drawings are used to denote the same or similar features, elements, or structures, and thus, a detailed explanation of the same or similar features, elements, or structures will not be repeated for each of the drawings.

Figure 1A:
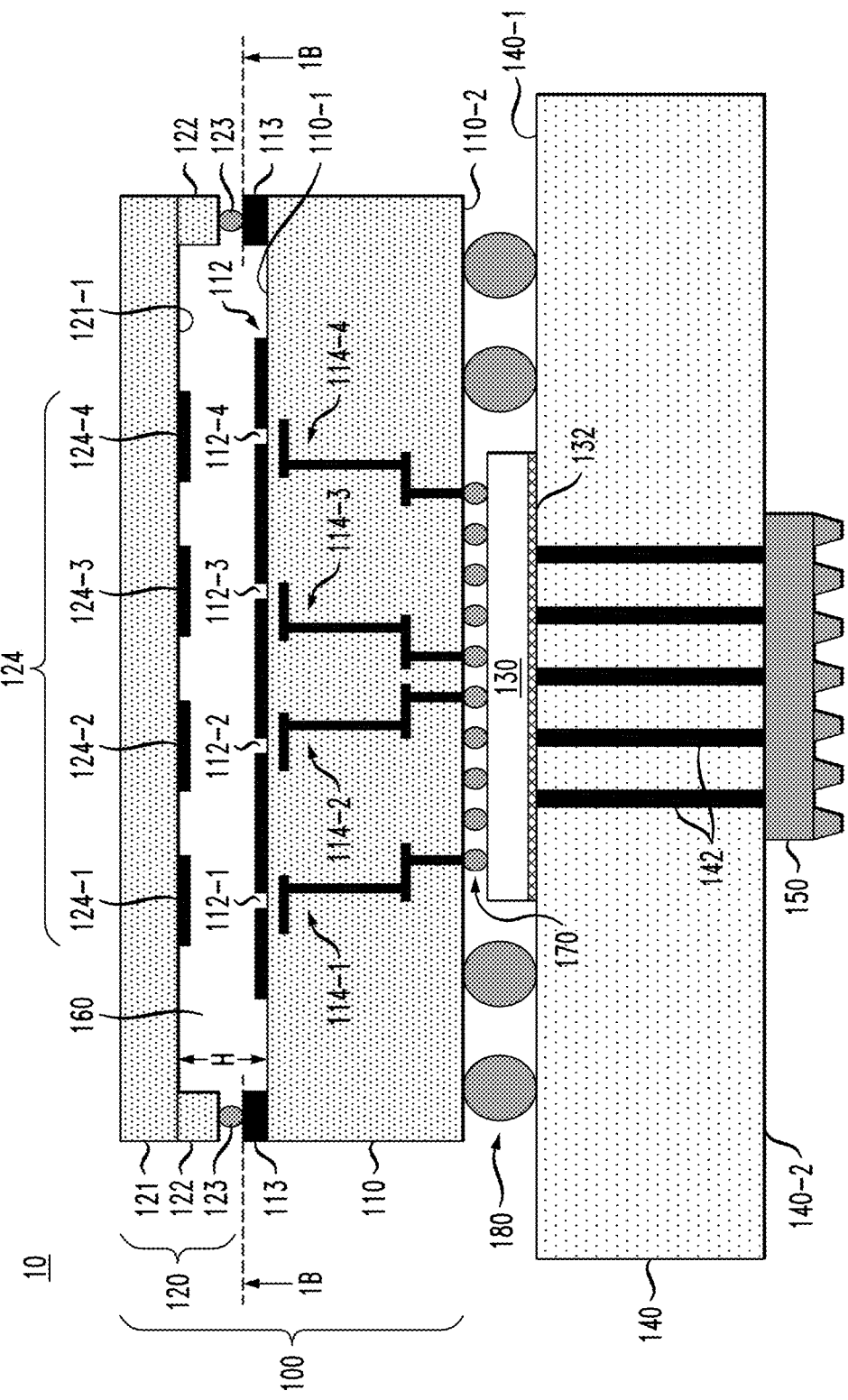
Figure 1B:
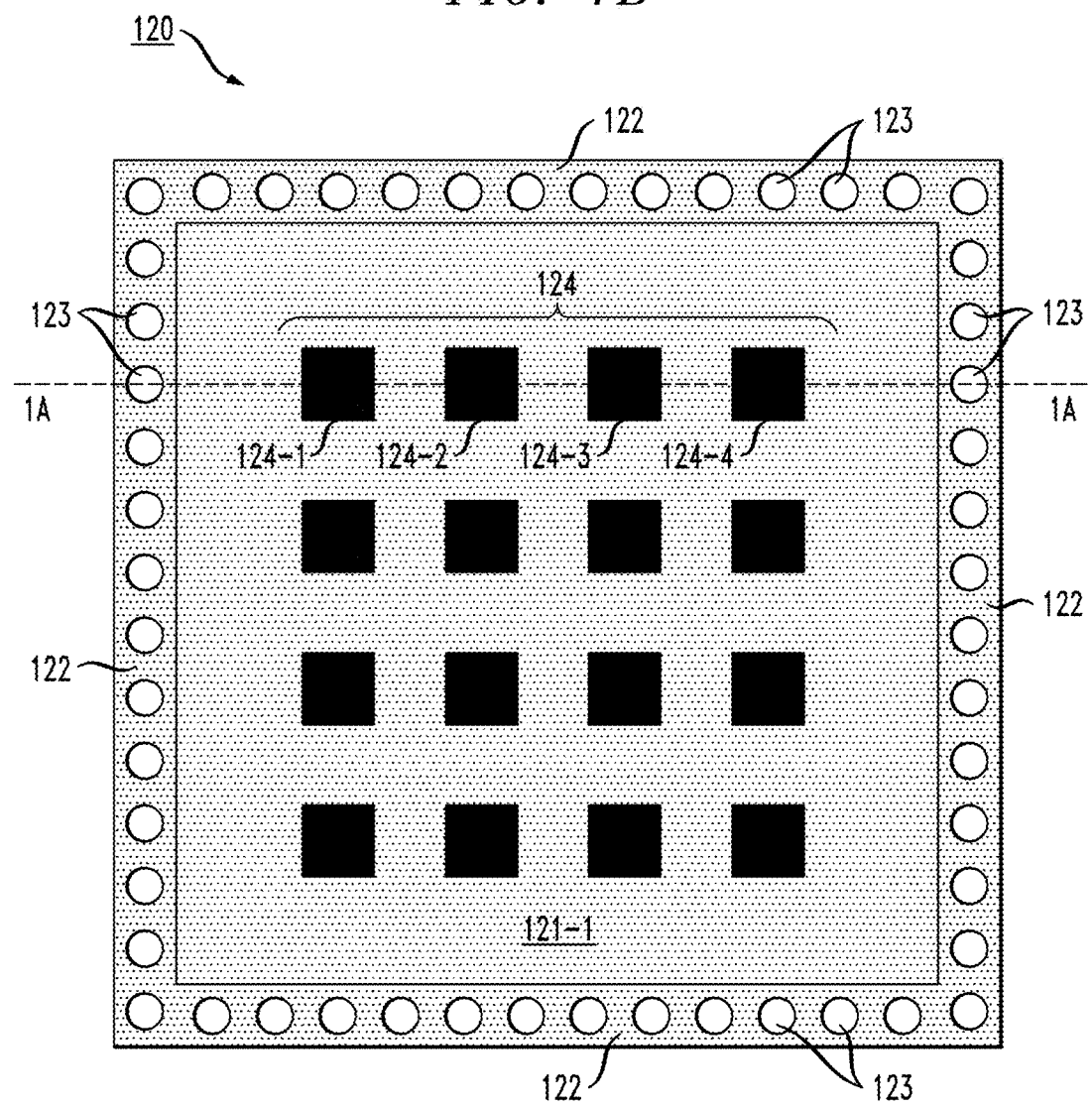

FIGS. 1A and 1B schematically illustrate a wireless communications package according to an embodiment of the invention. In particular, FIG. 1A is a schematic cross-sectional side view of a wireless communications package 10 comprising an antenna-in-package 100 (or "antenna package"), an RFIC chip 130, an application board 140, and a heat sink 150. The antenna package 100 comprises a package carrier 110 and a package cover 120. The package cover 120 is bonded to a first side 110-1 (e.g., top surface) of the package carrier 110 to provide an embedded air cavity 160 which, as explained in further detail below, enables the implementation of a high-performance integrated antenna system having good radiation characteristics for millimeter-wave operating frequencies and higher.

The RFIC chip 130 comprises a metallization pattern (not specifically shown) formed on an active surface (front side) of the RFIC chip 130, which metallization pattern includes a plurality of bonding/contact pads such as, for example, ground pads, DC power supply pads, input/output pads, control signal pads, associated wiring, etc., that are formed as part of a BEOL (back end of line) wiring structure of the RFIC chip 130. The RFIC chip 130 is electrically and mechanically connected to the antenna package 100 by flip-chip mounting the active (front side) surface of the RFIC chip 130 to a second side 110-2 (e.g., bottom surface) of the package carrier 110 using, for example, an array of solder ball controlled collapse chip connections (C4) 170, or other known techniques. Depending on the application, the RFIC chip 130 comprises RFIC circuitry and electronic components formed on the active side including, for example, a receiver, a transmitter or a transceiver circuit, and other active or passive circuit elements that are commonly used to implement wireless RFIC chips. The antenna package 100 is electrically and mechanically connected to the application board 140 using, for example, an array of BGA connections 180 or other similar techniques. The BGA connections 180 are formed between bonding/contact pads and wiring patterns of a metallization layer on the second side 110-2 of the package carrier 110 and corresponding bonding/contact pads and wiring patterns of a metallization layer on a first side 140-1 of the application board. The application board 140 further comprises a plurality of metallic thermal vias 142 that are formed in the application board 140 extending between the first side 140-1 and a second side 140-2 of the application board 140.

A layer of thermal interface material 132 is utilized to thermally couple the non-active (backside) surface of the RFIC chip 130 to a region of the application board 140 that is aligned to the plurality of metallic thermal vias 142. The layer of thermal interface material 132 serves to transfer heat from the RFIC chip 130 to the thermal vias 142, wherein the thermal vias 142 transfer the heat to the heat sink 150 to thereby dissipate heat which is generated by the RFIC chip 130.

As further shown in FIG. 1A, the package substrate 100 comprises an antenna ground plane 112 and a plurality of bonding pads 113, which are patterned on the first side 110-1 of the package carrier 110. The antenna ground plane 112 comprises a plurality of slots/apertures 112-1, 112-2, 112-3, and 112-4 that are patterned in the antenna ground plane 112 metallization layer. The package substrate 100 further comprises a plurality of antenna feed lines 114-1, 114-2, 114-3, 114-4, wherein each antenna feed line comprises a series of interconnected metallic traces and conductive vias that are formed are part of various alternating conductive and insulating/dielectric layers of the package carrier 110.

Furthermore, details of the package cover 120 according to an embodiment of the invention are collectively shown in FIGS. 1A and 1B. FIG. 1B is a schematic plan view of the package cover 120 as viewed in the direction indicated by the arrows of line 1B-1B in FIG. 1A. It is to be further noted that FIG. 1A depicts a cross-sectional view of the package cover 120 along line 1A-1A in FIG. 1B. As depicted in FIGS. 1A and 1B, the package cover 120 comprises a planar lid 121 and sidewalk 122 disposed around a periphery of the planar lid 121. The sidewalls 122 extend from a first side 121-1 of the planar lid 121. A series of solder balls 123 are formed on a bottom surface of the sidewalls 122. The solder balls 123 are aligned to corresponding ones of the bonding pads 113 that are peripherally disposed on the first side 110-1 of the package carrier 110. The solder balls 123 are used to bond the package cover 120 to the first side 110-1 of the package carrier 110 using a solder reflow process.

The planar lid 121 comprises an array of planar antenna elements 124 formed on the first side 122-1 of the planar lid 121. In one embodiment of the invention, the array of planar antenna elements 124 comprises an array of patch antenna elements, e.g., patch antenna elements 124-1, 124-2, 124-3, and 124-4 (which are specifically labeled in FIGS. 1A and 1B for purposes of discussion). In the embodiment shown in FIG. 1B, the array of planar antenna elements 124 comprises a 4×4 array of 16 patch antenna elements. In other embodiments of the invention, as explained in further detail below, antenna arrays can be formed a larger amount of patch antenna elements, e.g., 8×8 array of 64 patch antenna elements. Moreover, an antenna array can be divided into sub-arrays of patch antenna elements which are controlled by different RFIC chips.

As shown in FIG. 1A, the patch antenna elements 124-1, 124-2, 124-3, and 124-4 are disposed on the first side 121-1 of the planar lid 121 in alignment with the respective slots/apertures 112-1, 112-2, 112-3, and 112-4 of the ground plane 112. In this embodiment, the ground plane 112 serves as a common ground plane for each of the patch antenna elements 124-1, 124-2, 124-3, and 124-4, while the embedded air cavity 160 provides a low dielectric constant medium, i.e., air with a dielectric constant ≅1, between the ground plane 112 and the patch antenna elements 124-1, 124-2, 124-3, and 124-4. The spacing between the ground plane 112 and the patch antenna elements 124-1, 124-2, 124-3, and 124-4 will depend on the height H of the air cavity 160 and the thickness of the metallization of the ground plane 112 and the patch antenna elements 124-1, 124-2, 1.24-3, and 124-4. In one embodiment of the invention, the height H of the air cavity 160 is about 400 microns, and more generally, in a range of about 50 microns to about 2000 microns, depending on the operating frequency and other factors.

The antenna feed lines 114-1, 114-2, 114-3, 114-4 are configured to couple electromagnetic energy to and from the respective patch antenna elements 124-1, 124-2, 124-3, and 124-4 through the respective slots/apertures 112-1, 112-2, 112-3, and 112-4 of the ground plane 112. While the embodiment of FIG. 1A illustrates an aperture-coupled patch antenna configuration, other known techniques and configurations can be implemented to couple electromagnetic energy between an antenna feed line and a planar patch antenna element.

In the embodiment of FIG. 1A, the embedded air cavity 160 provides a low dielectric constant medium which serves to suppress or eliminate dominant surface waves that would otherwise exist with conventional patch antenna array designs in which the patch antenna elements and the ground plane are formed on opposing sides of a physical substrate made of dielectric or insulating material.

Indeed, in conventional patch antenna array designs, the substrate can be formed with dielectric/insulating material having a dielectric constant in excess of three, which can result in the creation of dominant surface waves that flow along the substrate surface between neighboring patch elements in the antenna array. These surfaces waves can produce currents at the edges, which, in turn, results in unwanted radiation that can adversely affect and disrupt the desired radiation pattern of the patch elements. Moreover, the surface waves can cause strong mutual coupling between the patch antenna elements in the antenna array, which adversely leads to significant shits in the input impedance and radiation patterns.

In the embodiment of FIG. 1A, no substrate layer exists between the ground plane 112 and the patch antenna elements 124-1, 124-2, 124-3, and 124-4. Instead, the embedded air cavity 160 is provided between the ground plane 112 and the patch antenna array 124 as a surface wave suppression technique that serves to eliminate dominant surface waves and thereby, enhance the radiation efficiency and radiation beam shape of the patch antenna array 124. The embedded air cavity design eliminates the need to implement additional surface wave suppression structures that would otherwise occupy too much area and increase the footprint of the patch antenna array. Moreover, while low dielectric constant materials such as foam and Teflon may be considered, these materials cannot bear the high temperatures and pressures that are encountered during various stages of the package fabrication process (e.g., BGA bonding, etc.).

The antenna package 100 can be fabricated using various types of materials and fabrication techniques. For instance, in one embodiment of the invention, the package cover 120 can be fabricated as follows. The planar lid 121 and sidewalls 122 can be fabricated from separate substrates that are bonded to each other. For example, the planar lid 121 can be fabricated from a first substrate having a metallization layer on one or both sides. The first substrate can be, for example, an organic buildup substrate, a printed circuit board laminate, a ceramic substrate, or some other type of substrate that is suitable for the given application. In. one embodiment, the planar lid 121 is formed with a thickness in a range of about 0.4 mm to about 2.0 mm. The metallization layer on one side of the first substrate is then patterned to form the array of planar antenna elements 124.

A second substrate is then attached to the surface of the first substrate on which the array of planar antenna elements 124 are formed. The second substrate can be formed of the same material as the first substrate. A milling process is then performed to mill away the central inner portion of the second substrate and expose the array of planar antenna elements 124 on the surface of the first substrate (e.g., the surface 121-1 of the planar lid 121), while leaving an outer peripheral portion of the second substrate bonded to the first substrate, thereby forming the sidewalls 122 and inner cavity region of the package cover 120. Thereafter, an array of solder balls (e.g., solder balls 123 as shown in FIGS. 1A and 1B) are formed on bottom surface of the sidewalls 122.

In one embodiment of the invention, the package cover 120 shown in FIGS. 1A and 1B can be bonded to the package carrier 110 using a solder reflow process. With this process, the package cover 120 is placed on top of the package carrier 110 with the array of solder balls 123 aligned to, and in contact with, corresponding ones of the bonding pads 113 on the first side 110-1 of the package carrier 110. A solder reflow process is then performed to melt the solder balls 123 and, thus, bond the package cover 120 to the package carrier 110. In this bonding process, self-alignment of the solder balls 123 of the package cover 120 to the bonding pads 113 on the package carrier 110 ensures alignment of the patch antenna elements 124-1, 124-2, 124-3, and 124-4 with the respective slots/apertures 112-1, 112-2, 112-3, and 112-4 of the ground plane 112.

In another embodiment of the invention, the package cover 120 can be bonded to the package carrier 110 using an epoxy adhesive or some other adhesive material. In particular, with an epoxy adhesion process, the solder balls 123 and bonding pads 133 of FIG. 1A are not utilized. Instead, the bottom surfaces of the sidewalls 122 are bonded to the first side 110-1 of the package carrier 110 using an epoxy adhesive, for example. For epoxy adhesion, the package cover 120 is attached to the package carrier 110 using fiducial marks or through-via holes for mechanical alignment.

In one embodiment of the invention, the package carrier 110 comprises a multilayer organic carrier that can be constructed using known carrier fabrication technologies such as SLC (surface laminar circuit), HDI (high density interconnect), or other carrier fabrication techniques that enable the formation of organic-based multilayered circuit boards with high integration density. With these carrier fabrication techniques, a carrier substrate can be formed from a stack of laminated layers comprising alternating layers of metallization and dielectric/insulator materials, wherein the metallization layers are separated from overlying and/or underlying metallization layers by a respective layer of dielectric/insulating material.

The metallization layers can be formed of copper and the dielectric/insulating layers can be formed of an industry standard FR4 insulating layers comprised of fiberglass epoxy material. Other types of materials can be used for the metallization and insulating layers. Moreover, these technologies enable the formation of small conductive vias (e.g., partial or buried vias between adjacent metallization layers) using laser ablation, photo imaging, or etching, for example, to enable the formation of high density wiring and interconnect structures within the carrier substrate.

In the embodiment of FIG. 1A, as noted above, the plurality of antenna feed lines 114-1, 114-2, 114-3, and 114-4 of the package carrier 110 each comprise a series of interconnected metallic traces and conductive vias that are formed are part of various alternating conductive and insulating/dielectric layers of the package carrier 110. While the package carrier 110 of FIG. 1A is generically depicted to show only the antenna feed lines 114-1, 114-2, 114-3, 114-4, it is to be understood that the package carrier 110 comprises other package components such as power and ground planes, control lines, baseband signal lines, and other possible active circuitry. In one embodiment of the invention, the package carrier 110 can be fabricated using the techniques and substrate build-up structures as disclosed in co-pending, commonly assigned U.S. patent application Ser. No. 13/685,262, filed on Nov. 26, 2012, entitled Millimeter-Wave Radio Frequency Integrated Circuit Packages With Integrated Antennas, which is incorporated herein by reference. An exemplary embodiment of a package carrier, which can be fabricated using the techniques and structures as disclosed in U.S. patent application Ser. No. 13/685,262, will be discussed in further detail below with reference to FIG. 8, for example.

Figure 2:
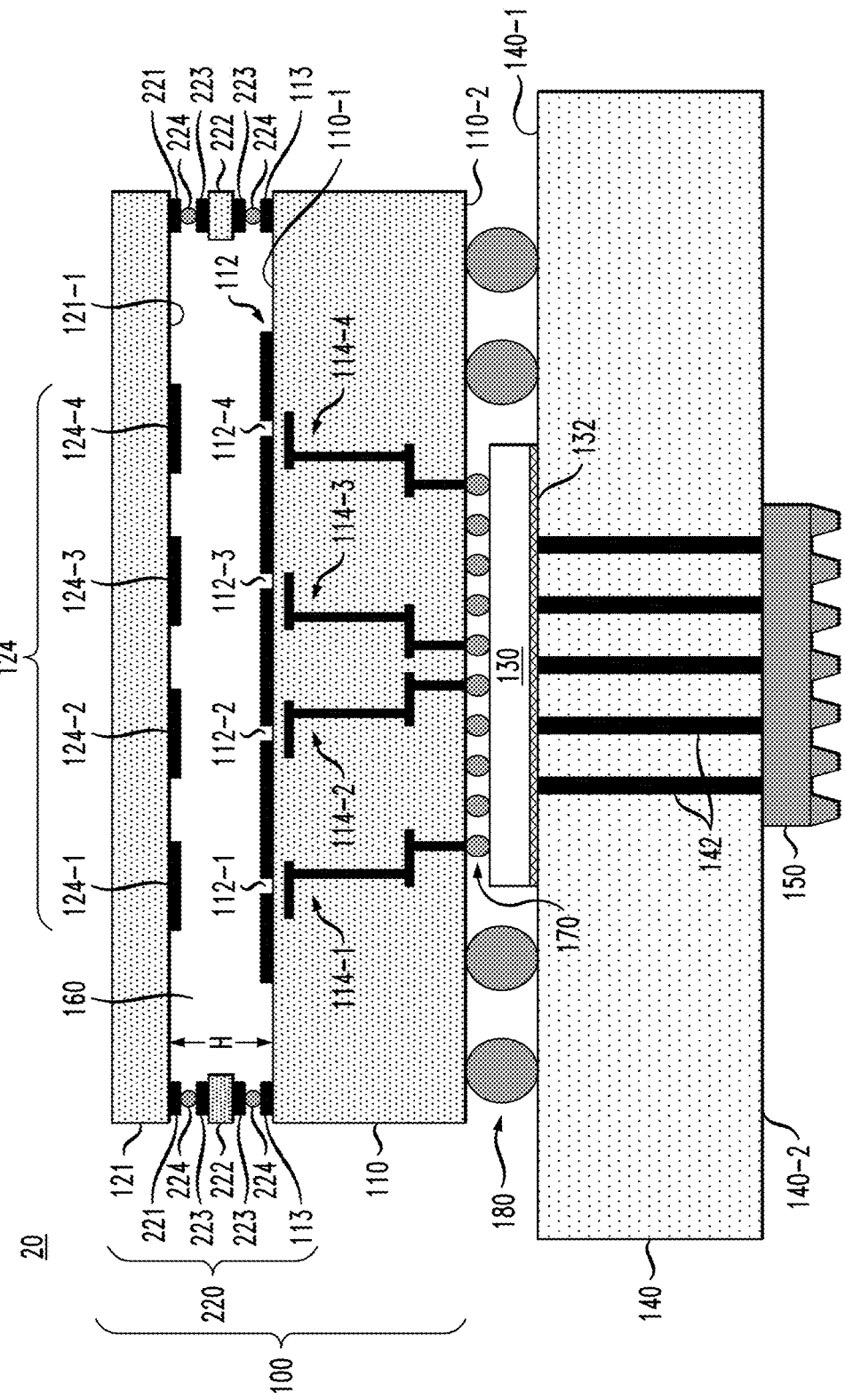
FIG. 2 is a schematic cross-sectional side view of a wireless communications package according to another embodiment of the invention.

FIG. 2 is a schematic cross-sectional side view of a wireless communications package according to another embodiment of the invention. In particular, FIG. 2 illustrates a wireless communications package 20 that is similar to the embodiment of FIGS. 1A/1B, but with an alternate embodiment for constructing a package cover 220 and bonding the package cover 220 to the package carrier 110. As shown in FIG. 2, the package cover 220 comprises a separate planar lid 121 and frame structure 222. The frame structure 222 comprises a series of bonding pads 223 formed on the both sides thereof. The planar lid 121 comprises a series of corresponding pads 221 disposed around and peripheral surface region on the first side 121-1 of the planar lid 121. A plurality of micro solder balls 224 (e.g., 50 um solder balls) are used to bond the frame structure 222 to the planar lid 121 and to the package carrier 110 during a solder reflow process.

In one embodiment of the invention, the frame structure 222 of FIG. 2 can be fabricated by from a separate substrate having copper metallization on both sides thereof. In one example embodiment, the substrate (forming the frame structure 222) can have a thickness of about 240 microns, for example, although the thickness of the substrate can vary depending on the cavity height H that is desired for the given application. The copper metallization on both sides of the substrate can be patterned to form the bonding pads 223. A central region of the substrate is then milled away to form a rectangular-shaped frame structure 222, having a footprint that corresponds to the peripheral surface footprint of the planar lid 121.

In one embodiment of the invention, the package cover 220 shown in FIG. 2 can be bonded to the package carrier 110 using a solder reflow process. With this process, the solder balls 224 may be formed on the bonding pads 221 of the planar lid 121 and the bonding pads 113 of the package carrier 110 prior to a bonding process. The frame structure 222 is placed between the planar lid 121 and the package carrier 110 with the solder balls 224 of the planar lid 121 and package carrier 110 aligned to, and in contact with corresponding ones of the bonding pads 223 on the upper and lower sides of the frame structure 222. A solder reflow process is then performed to melt the solder balls 224 and, thus, bond the package cover 220 to the package carrier 110. In this bonding process, the solder reflow process ensures self-alignment of the patch antenna elements 124-1, 124-2, 124-3, and 124-4 with the respective slots/apertures 112-1, 112-2, 112-3, and 112-4 of the ground plane 11.2.

Figure 3:
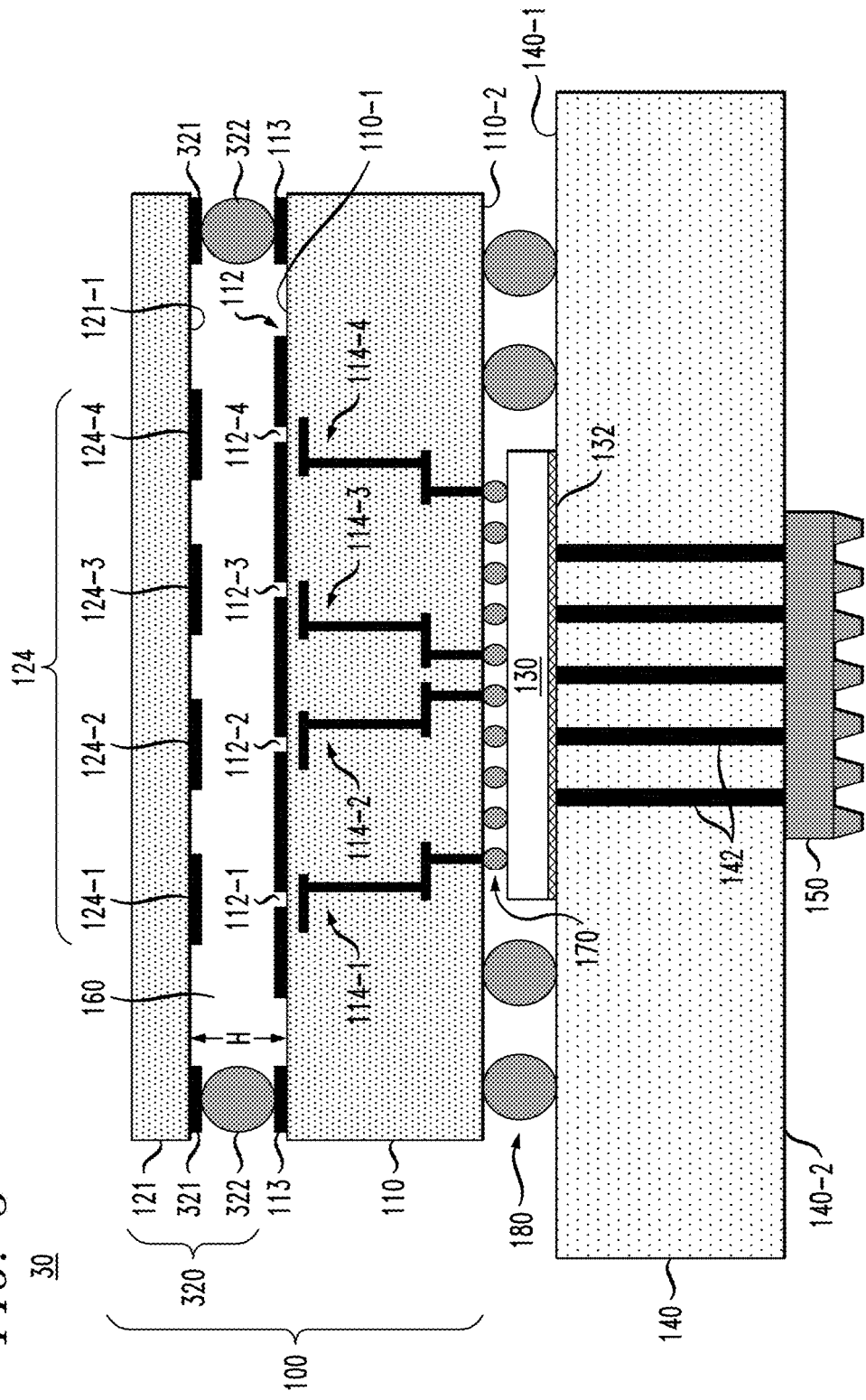
FIG. 3 is a cross-sectional schematic side view of a wireless communications package according to yet another embodiment of the invention.

FIG. 3 is a cross-sectional schematic side view of a wireless communications package according to yet another embodiment of the invention. In particular, FIG. 3 illustrates a wireless communications package 30 that is similar to the embodiment of FIGS. 1A/1B, but with an alternate embodiment for constructing a package cover 320 and bonding the package cover 320 to the package carrier 110. As shown in FIG. 3, the package cover 320 comprises a separate planar lid 121 and bonding structure comprising a series of under bump metallization pads 321 and large solder balls 322 (e.g., BGA solder balls). In the example embodiment of FIG. 3, the large BGA solder balls 322 serve a dual purpose of bonding the planar lid 121 to the package carrier 110, as well as providing a means to provide sufficient spacing between the planar lid 121 and the package carrier 110 to define the embedded air cavity 160 with a desired cavity height H. In other words, as compared to the previous embodiments of FIGS. 1A/1B and 2, the use of large BGA solder halls eliminates the need for fabricating separate sidewall or frame structures 122 and 222.

In one embodiment of the invention, the package cover 320 shown in FIG. 3 can be bonded to the package carrier 110 using a solder reflow process. With this process, the planar lid 121 is placed on the package carrier 110 with the BGA solder balls 322 aligned to, and in contact with corresponding ones of the bonding pads 113 on the first side 110-1 of the package carrier 110. A solder reflow process is then performed to melt the solder balls 322 and, thus, bond the package cover 320 to the package carrier 110. In this bonding process, the solder reflow process ensures self-alignment of the patch antenna elements 124-1, 124-2, 124-3, and 124-4 with the respective slots/apertures 112-1, 112-2, 112-3, and 112-4 of the ground plane 112.

As noted above, the use of the embedded air cavity 160 provides a surface wave suppression technique that enhances the radiation characteristics of phased array antenna systems according to embodiments of the invention. While the planar lid 121 on which the planar antenna elements are formed may result in some mutual coupling between the antenna elements due to surface waves that flow on the surface 121-1 of the planar lid 121, such surface waves are insubstantial and have minimal, if no, adverse effect on the radiation efficiency and desired radiation patterns of the phased array antenna system. Moreover, to minimize any adverse effect that the planar lid 121 may have on the radiation efficiency and radiation patterns of the phased array antenna, the planar lid 121 is formed as thin as possible and with materials having a low dielectric constant.

Depending on the size of the integrated phased array antenna system, the area of the package cover can be relatively large, which may result in sagging or bowing of the planar lid 121 portion of the package cover on which the planar antenna elements are formed. Various techniques according to embodiments of the invention can be implemented to prevent bowing or sagging of the planar lid 121. Such techniques will be described in further detail below with reference to FIGS. 4A/4B, 5, 6, and 7, for example.

Figure 4A:
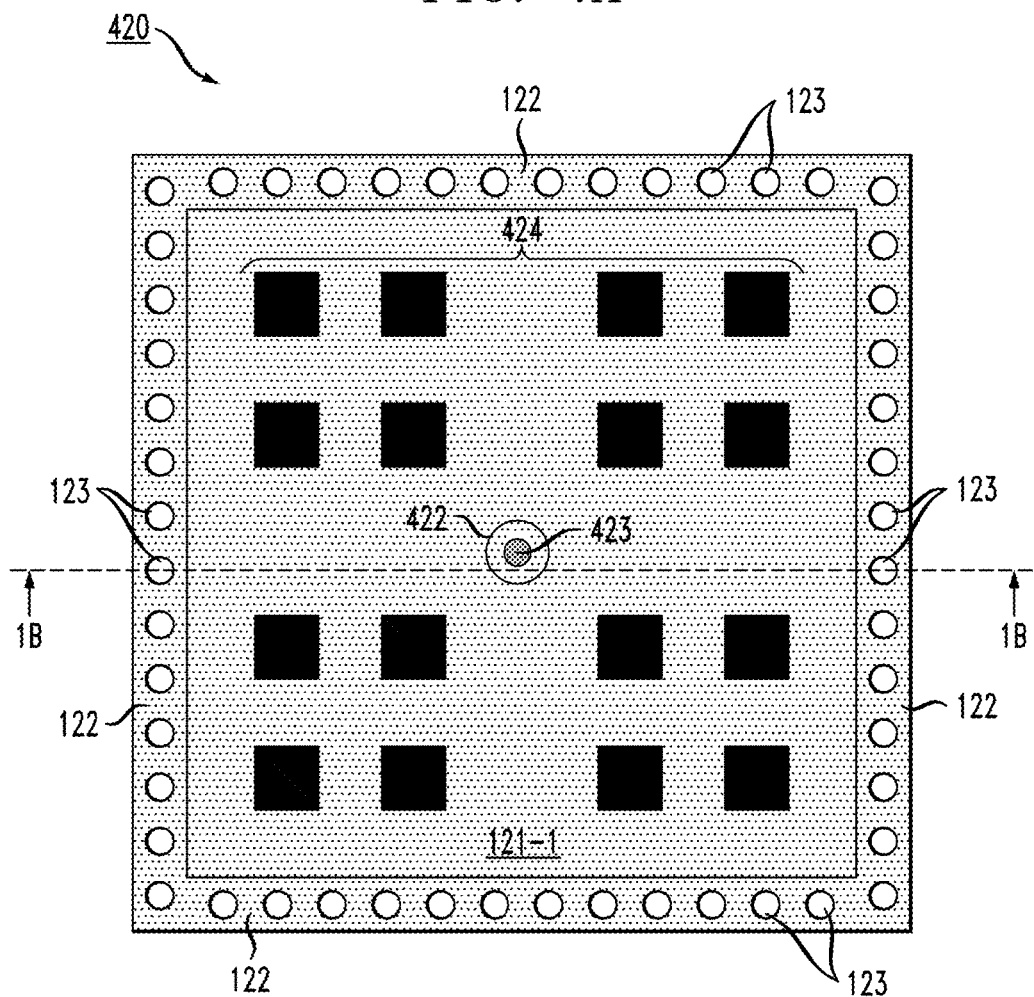
Figure 4B:
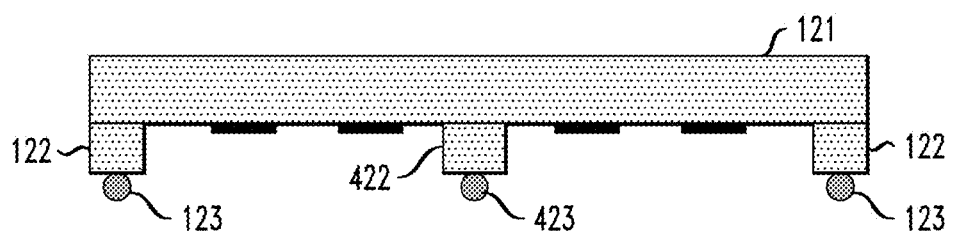

FIGS. 4A and 4B schematically illustrate an antenna package cover 420 according to another embodiment of the invention, which comprises structures to prevent sagging or bowing of the antenna package cover. FIG. 4A is a schematic plan view of the antenna package cover 420, and FIG. 4B is a schematic side view of the antenna package cover 420 along line 4B-4B of FIG. 4A. Referring to FIGS. 4A/4B, the package cover 420 is similar the embodiment of the package cover 120 shown in FIG. 1B, for example, but where a support post 422 and corresponding solder bump 423 are disposed within a central region on the inner side 121-1 of the planar lid 121.

As shown in FIG. 4B, the support post 422 has a vertical height that is substantially the same as the sidewalls 122. The support post 422 and associated solder bump 423 are bonded to a corresponding bonding pad that is formed on the first side 110-1 of the package carrier 110. In the embodiment shown in FIGS. 4A/4B, the support post 422/solder bump 423 structure provides structural support in a central region of the package cover 420 to prevent warpage or sagging of the planar lid 121.

FIG. 4A shows an array of planar antenna elements 424 having 16 patch antenna elements evenly and symmetrically divided into four groups of 2×2 patch antenna elements. The exemplary layout shown in FIG. 4A is implemented to provide space in a central region of the planar lid 121 to accommodate the additional support post 422/solder bump 423 structure, while maintaining sufficient spacing of the antenna patch elements away from the additional support post 422/solder bump 423 structure. A symmetric layout as depicted in FIG. 4A is effective to eliminate or otherwise significantly reduce any adverse effects that the additional support post 422/solder bump 423 structure (and other structures and components of package cover 420) may have on the radiation properties (e.g., efficiency, directivity, etc.) of the array of planar antenna elements 424.

In one embodiment of the invention, the support post 422 is formed from the same substrate that is milled/patterned to form the sidewalls 122, using the same or similar techniques as discussed above for fabricating the package cover 120. Although one support post 422 is shown in FIGS. 4A/4B, in other embodiments of the invention, two or more separate support posts and corresponding solder bumps can be strategically formed/disposed in other regions of the planar lid 121 to provide structural support and prevent warpage or sagging of the planar lid 121, and well as provide additional bonding sites for bonding the package cover 420 to the package carrier 110.

In another embodiment of the invention, the additional support posts (e.g., support post 422) can be bonded to the surface of the package carrier using an epoxy adhesive. In yet another embodiment of the invention, additional BGA solder balls can be used in place of the one or more additional support posts (e.g., support post 422) to bond the planar lid 121 to the carrier substrate 110 using techniques as discussed above with reference to FIG. 3, as well as to provide structural support in the central region of the package cover 420 to prevent warpage or sagging of the planar lid 121.

Figure 5:
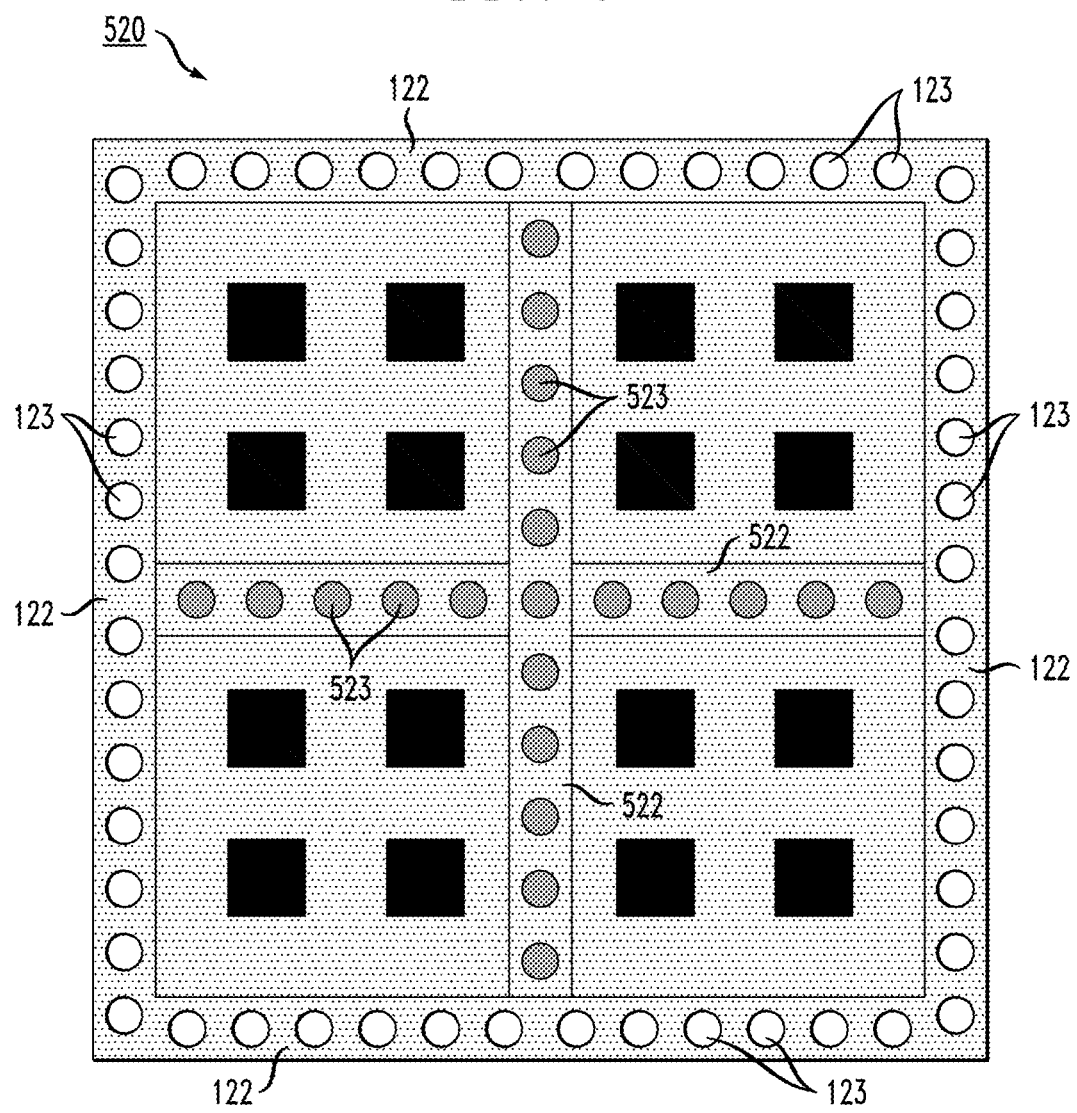
FIG. 5 is a schematic plan view of an antenna package cover according to another embodiment of the invention, which comprises structures to prevent warpage or sagging of the antenna package cover.

FIG. 5 is a schematic plan view of an antenna package cover according to another embodiment of the invention, which comprises structures to prevent warpage or sagging of the antenna package cover. FIG. 5 illustrate a package cover 520 which is similar to the embodiment of the package cover 420 shown in FIG. 4A, for example, but where elongated support bars 522 are disposed along central axes of the package cover 520. The elongated support bars 522 have a vertical height that is substantially the same as the sidewalls 122.

In one embodiment of the invention, as shown in FIG. 5, a series of solder bumps 523 are formed on a bottom surface of the elongated support bars 522 for bonding to corresponding bonding pads that are longitudinally arranged across the surface of the package carrier 110 in alignment with the elongated support bars 522. In other embodiment of the invention, the bottom surfaces of the elongated support bars 522 (and sidewalls 122) can be bonded to the surface of the package carrier using an epoxy adhesive, for example.

Figure 6:
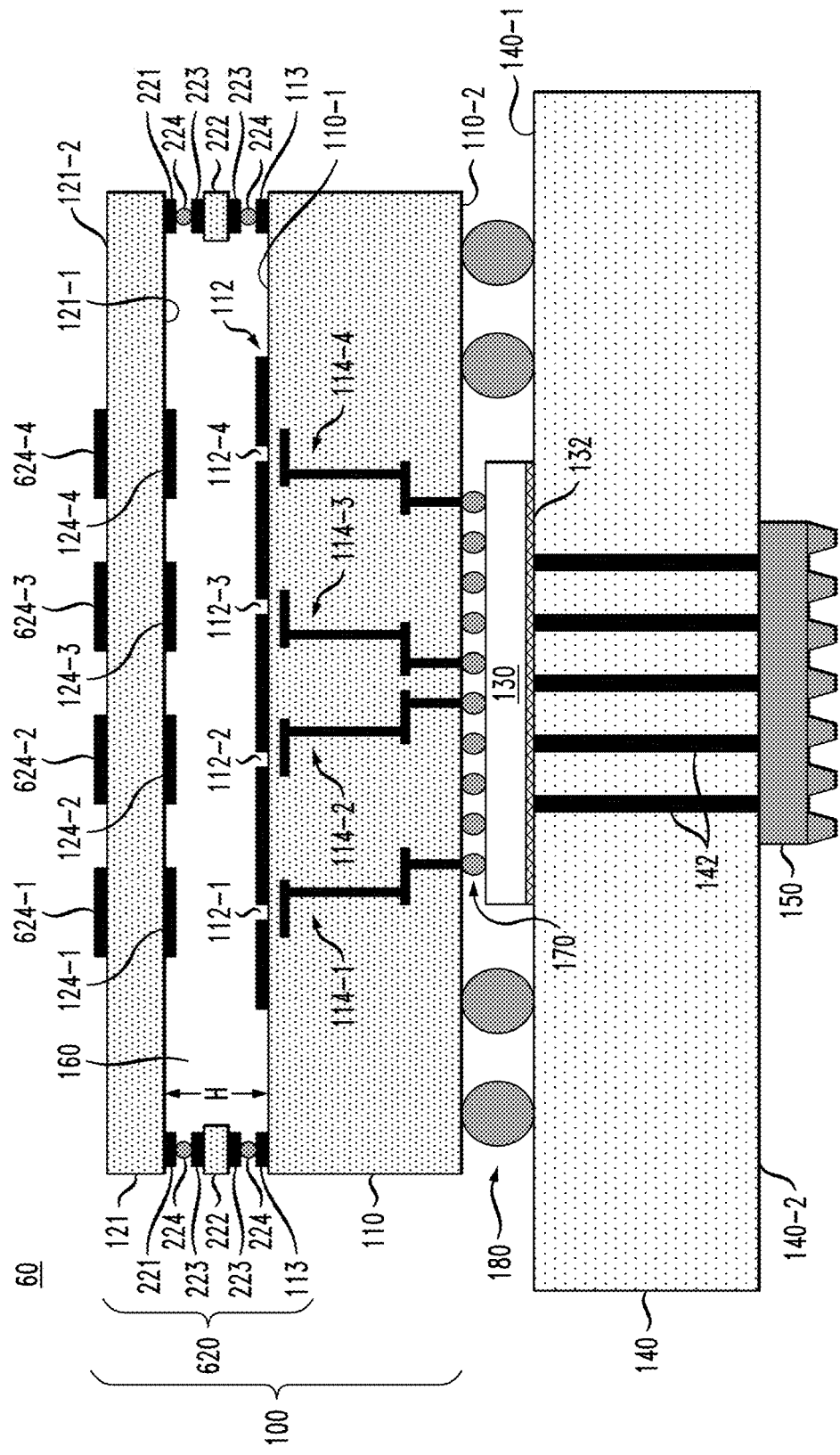
FIG. 6 is a schematic cross-sectional side view of a wireless communications package according to another embodiment of the invention.

FIG. 6 is a schematic cross-sectional side view of a wireless communications package according to another embodiment of the invention. In particular, FIG. 6 illustrates a wireless communications package 60 which is similar to the embodiment of FIG. 2, but with an alternate embodiment of a package cover 620 having metallic support structures 624-1, 624-2, 624-3, and 624-4 which are formed on a second side 121-2 (top side) of the planar lid 121 to prevent warpage or sagging of the planar lid 121. In one embodiment of the invention, the metallic support structures 624-1, 624-2, 624-3, and 624-4 have a similar footprint and layout as the array of planar antenna elements 124. For example, as depicted in FIG. 6, the metallic support structures 624-1, 624-2, 624-3, and 624-4 are aligned with the respective patch antenna elements 124-1, 124-2, 124-3, and 124-4 on opposing sides 121-1 and 121-2 of the planar lid 121.

The formation of the metallic support structures 624-1, 624-2, 624-3, and 624-4 and the respective patch antenna elements 124-1, 124-2, 124-3, and 124-4 on opposing sides 121-2 and 121-1 of the planar lid 121 serves to improve manufacturability and prevent or minimize warpage during manufacture of the package cover, and to add structural integrity to the planar lid 121 to prevent sagging during and after construction of the wireless communications package. In particular, during manufacturing of the planar lid 121, the copper loading on both sides of the planar lid 121 serves to prevent warpage due to the thermal expansion and contraction of the copper.

In particular, if copper metallization is formed on one side of a relatively large and thin planar lid 121, the forces applied to the one side of the planar lid 121 due to the thermal expansion and contraction of the copper metallization could result in warpage of the planar lid 121. On the other hand, by having similar metallization on both sides of the planar lid 121, similar forces are exerted by the thermal expansion and contraction of the copper metallization on both sides of the planar lid 121, which ensures that the planar lid 121 remains flat. It is believed that copper loading on both sides of the planar lid 121 should be within 5% to 10% to ensure flatness of the package cover.

Figure 7:
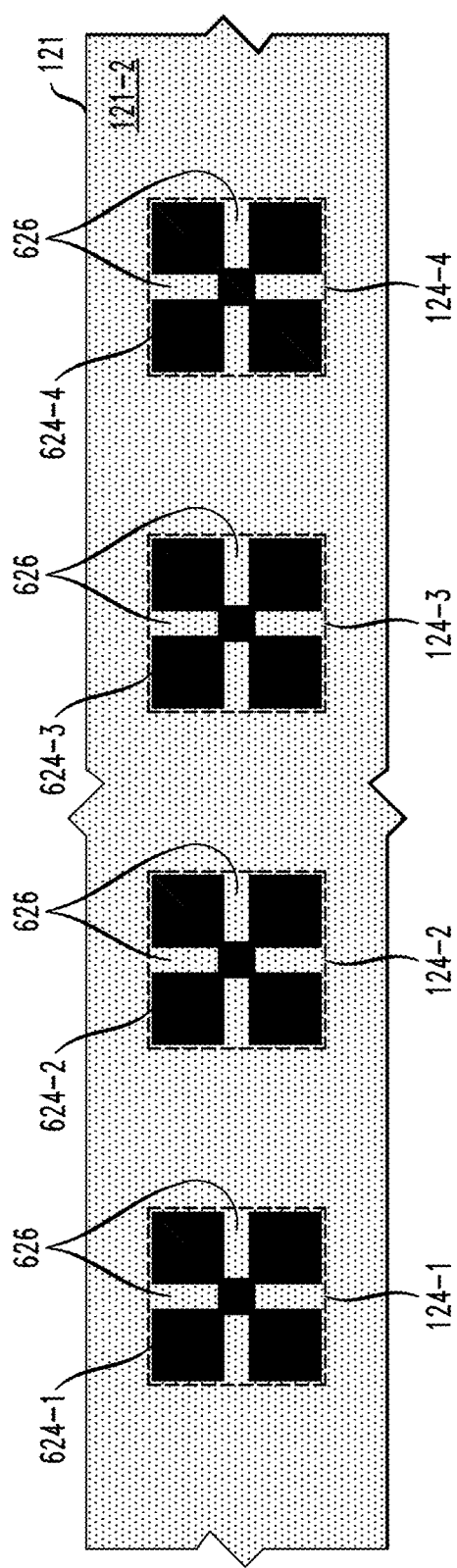
FIG. 7 is a schematic plan view of a portion of an upper surface of the antenna package cover of FIG. 6 showing a pattern of metallic structures to prevent warping or sagging of the antenna package cover, according to an embodiment of the invention.

While the metallic support structures 624-1, 624-2, 624-3, and 624-4 on the top side 121-2 of the planar lid are useful to prevent warpage and sagging, the metallic support structures 624-1, 624-2, 624-3, and 624-4 should be deigned in a way that minimizes or otherwise does not have any adverse effect on the radiation properties of the patch antenna elements 124-1, 124-2, 124-3, and 124-4. FIG. 7 is a schematic plan view of a portion of the upper surface 121-2 of the antenna package cover 620 of FIG. 6 showing a pattern of the metallic structures 624-1, 624-2, 624-3, and 624-4 to prevent warping or sagging of the antenna package cover, according to an embodiment of the invention.

As shown in FIG. 7, each of the metallic structures 624-1, 624-2, 624-3, and 624-4 has a "leaf-shaped" pattern that is similar in appearance to a square-shaped "four leaf clover". More specifically, the metallic structures 624-1, 624-2, 624-3, and 624-4 are essentially rectangular-shaped patches having an outer perimeter footprint that is the same as, and aligned to, the underlying patch antenna elements 124-1, 124-2, 124-3, and 124-4 (shown as dashed outlines in FIG. 7), with a plurality of etched slots 626. The etched slots 626 are provided to minimize any effect that the metallic structures 624-1, 624-2, 624-3, and 624-4 may have on the radiation properties of the underlying patch antenna elements 124-1, 124-2, 124-3, and 124-4, while providing necessary structural support to prevent warpage and sagging of the planar lid 121. While the size and spacing of the slots 626 does have some effect on the tuning characteristics of the patch antenna elements 124-1, 124-2, 124-3, and 124-4, other structural parameters of the antenna structures can be adjusted to obtain desired radiation characteristics when metallic support structures (e.g., metallic structures 624-1, 624-2, 624-3, and 624-4) are implemented.

Figure 8:
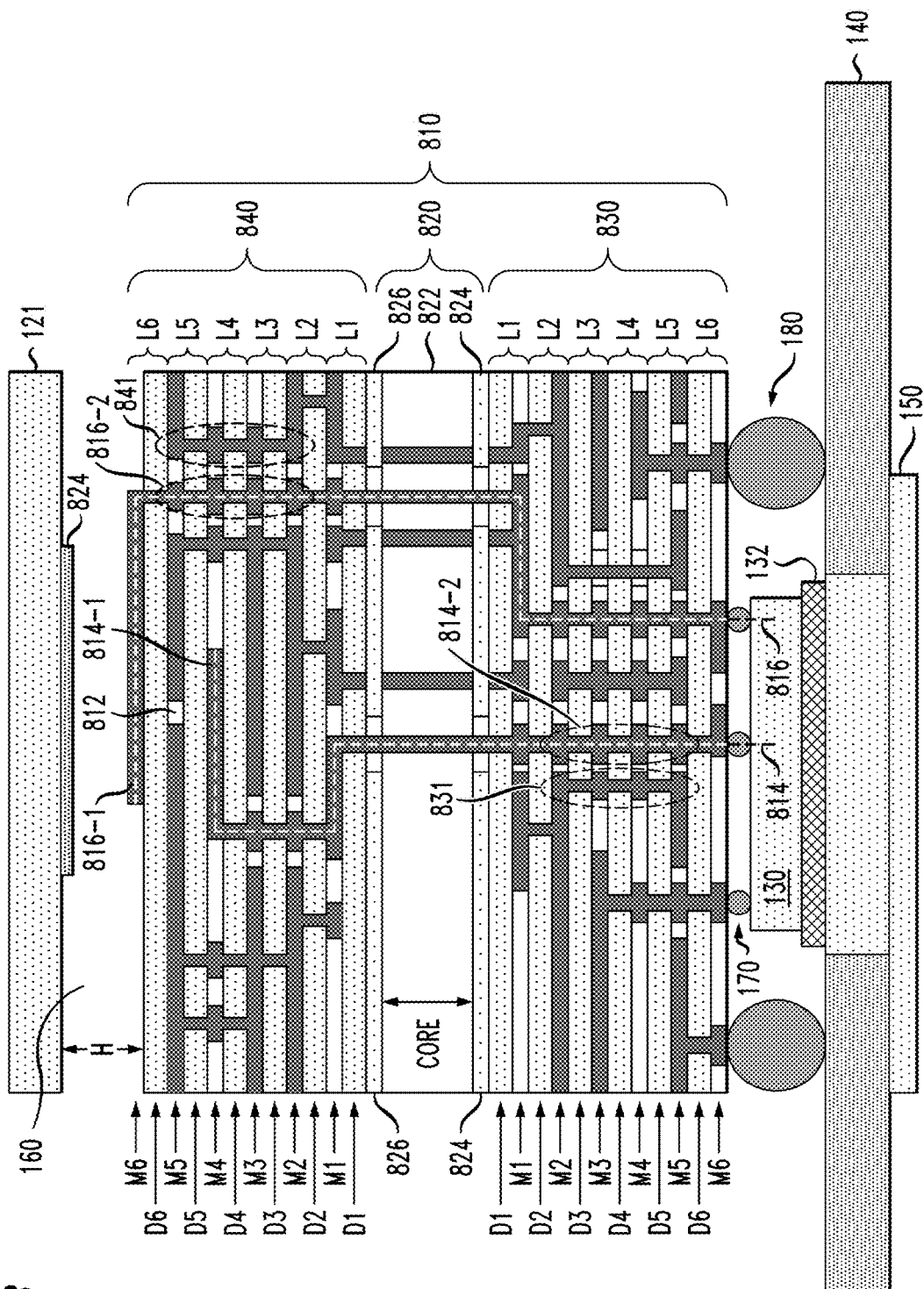
FIG. 8 is a schematic side view of a wireless communications package showing details of a build-up structure of an antenna package carrier according to an embodiment of the invention.

FIG. 8 is a schematic side view of a wireless communications package showing details of a build-up structure of an antenna package carrier according to an embodiment of the invention. In particular, FIG. 8 is a partial view of a wireless communication package 80 which is similar the embodiments discussed above, but wherein a package carrier 810 is shown comprising a central core layer 820, an interface layer 830, and an antenna layer 840. As noted. above, the package carrier 810 can be fabricated using methods and structures as disclosed in. U.S. patent application Ser. No. 13/685,262.

In the embodiment of FIG. 8, the central core layer 820 provides a structurally sturdy layer upon which to build the interface layer 830 and the antenna layer 840 on opposite sides of the core layer 820. In one embodiment, the core layer 820 comprises a substrate layer 822 having a first ground plane 824 formed on a first side of the substrate layer 822, and a second ground plane 826 formed on a second side of the substrate layer 822. The substrate layer 822 can be formed of standard FR4 material, or other standard materials that are typically used to construct a standard. PCB (printed circuit board). The substrate 822 can be formed with other materials having mechanical and electrical properties that are similar to FR4, providing a relatively rigid structure to support the package carrier 810.

The interface layer 830 comprises a plurality of laminated layers L1, L2, L3, L4, L5, L6, wherein each laminated layer L1, L2, L3, L4, L5, L6 comprises a respective patterned conductive layer M1, M2, M3, M4, M5, M6 formed on a respective dielectric/insulating layer D1, D2, D3, D3, D5, D6. The antenna layer 840 comprises a plurality of laminated layers L1, L2, L3, L4, L5, L6, wherein each laminated layer L1, L2, L3, L4, L5, L6 comprises a respective patterned conductive layer M1, M2, M3, M4, M5, M6 formed on a respective dielectric/insulating layer D1, D2, D3, D3, D4, D5, D6, which form various components in the antenna layer 840.

The laminated layers L1, L2, L3, L4, L5, L6 of the interface and antenna layers 830 and 840 can be formed using state of the art fabrication techniques such as SLC or similar technologies, which can meet the requisite tolerances and design rules needed for high-frequency applications such as millimeter-wave applications. With an SLC process, each of the laminated layers are separately formed with a patterned metallization layer, wherein the first layers Li of the interface and antenna layers 830 and 840 are bonded to the core layer 820, and wherein the remaining laminated layers L2, L3, L4, L5 and L6 (or the respective interface and antenna layers 830 and 840) are sequentially bonded together with an appropriate process that may include, and may not include an adhesive or epoxy material.

As further shown in FIG. 8, conductive vias are formed through the core layer 820 and through the dielectric/insulating layers D1, D2, D3, D3, D5, D6 of the interface and antenna layers 830 and 840. The conductive vias that are formed through a given dielectric/insulating layer are connected to via pads that are pattered from the metallization layers disposed on each side of the given dielectric/insulating layer.

The interface layer 830 includes a power plane layer (e.g., metal layer M3), one or more ground plane layers (e.g., metal layers M2 and M5), a low frequency I/O signal line layer (e.g., metal layer M4), and a contact pad layer (e.g., metal layer M6). For example, the power plane layer (e.g., M3) serves to distribute power to one or more of the RFIC chips 130 from the application board 140 using interconnects (e.g., vias and horizontal traces) which are formed through the interface layer 830 to connect certain BGA connections 180 and C4 connections 170 to the power plane metallization layer (e.g., M3).

In addition, the low frequency signal line layer (e.g., M4) serves to route control signals between one or more of the RFIC chips 130 which are flip-chip bonded to the package carrier 810, and to route I/O and control signals between the application board 140 and the one or more of the RFIC chips 130 using interconnects (e.g., vias and horizontal traces) which are formed through the interface layer 830 and which form connections from certain BGA connections 180 and C4 connections 170 to the low frequency signal line metallization layer (e.g., M4).

The antenna layer 840 comprises a ground plane formed from the metallization layer M5, which serves as the antenna ground plane for patch antenna element 824 formed on the bottom of the planar lid 121. The antenna ground plane (metal layer M5) has a slot/aperture 812 which is aligned to the patch antenna element 824. A first antenna feed line (denoted by the dashed line 814) is routed through the interface layer 830, the core layer 820 and the antenna layer 840. The first antenna feed line 814 comprises a horizontal stripline portion 814-1 which is patterned on the metallization layer M4 and aligned to the slot/aperture 812 of the antenna ground plane. In this embodiment, the ground metallization layers M5 and M3 of the antenna layer 840 serve as the ground lines for the signal line of the stripline portion 814-1, for example. The horizontal stripline portion 814-1 is configured to couple electromagnetic energy to and from the patch antenna element 824 through the slot/aperture 812, thereby providing an aperture-coupled antenna configuration, as discussed above with reference to FIGS. 1A and 1B, for example.

As further shown in FIG. 8, a second antenna feed line (denoted by the dashed line 816) is routed through the interface layer 830, the core layer 820, and the antenna layer 840. The second antenna feed line 816 comprises a horizontal microstrip portion 816-1 which is patterned on the metallization layer M6 and aligned with the patch antenna element 824. The horizontal microstrip portion 816-1 is configured to couple electromagnetic energy to and from the patch radiator element 824, thereby providing an electromagnetically-coupled patch antenna configuration. In the example embodiment of FIG. 8, the first and second antenna feed lines 814 and 816 can be configured to enable polarization diversity (e.g., horizontal and vertical polarization) when transmitting and/or receiving of electromagnetic signals, as is understood by one of ordinary skill in the art. Moreover, while only one patch antenna element 824 and corresponding antenna feed lines 814 and 816 are shown in FIG. 8, for phased array antenna applications, the planar lid 121 will have a plurality of the patch antenna elements and the package carrier 810 will have a similar feed line configuration as shown in FIG. 8 for each patch antenna element. Moreover, while two antenna feed lines 814 and 816 are shown for feeding the patch antenna element 824, the package carrier 810 can be constructed to have only one antenna feed line (e.g., feed line 814 or 816) that feeds each patch antenna element, depending on the target application.

It is to be further noted that in the example embodiment of FIG. 8, each of the layers 820, 830 and 840 comprise ground planes that are used for purposes of providing shielding and to provide ground elements for microstrip or stripline transmission lines, for example, that are formed by horizontal traces. For example, the metallization layers M2 and M3 of the antenna layer 840 can be ground planes that serve as RF shields to shield the RFIC chip 130 from exposure to incident electromagnetic radiation captured by the patch antennas.

Moreover, the ground planes M2 and M3 of the antenna layer 840, the ground planes 824 and 826 of the core layer 820, and the ground planes M2 and M5 of the interface layer 830, are configured to, e.g., (i) provide shielding between horizontal signal line traces formed in adjacent metallization layers, (ii) serve as ground planes for microstrip or stripline transmission lines, for example, that are formed by the horizontal signal line traces, and (ii) provide grounding for vertical shields (e.g., elements 831 and 841) that formed by a series of vertically connected grounded vias which surround portions of the antenna feed lines (e.g., vertical portions 814-2 and 816-2), for example. For very high frequency applications, the implementation of stripline transmission lines and ground shielding helps to reduce interference effects of other package components such as the power plane(s), low frequency control signal lines, and other transmission lines.

Figure 9:
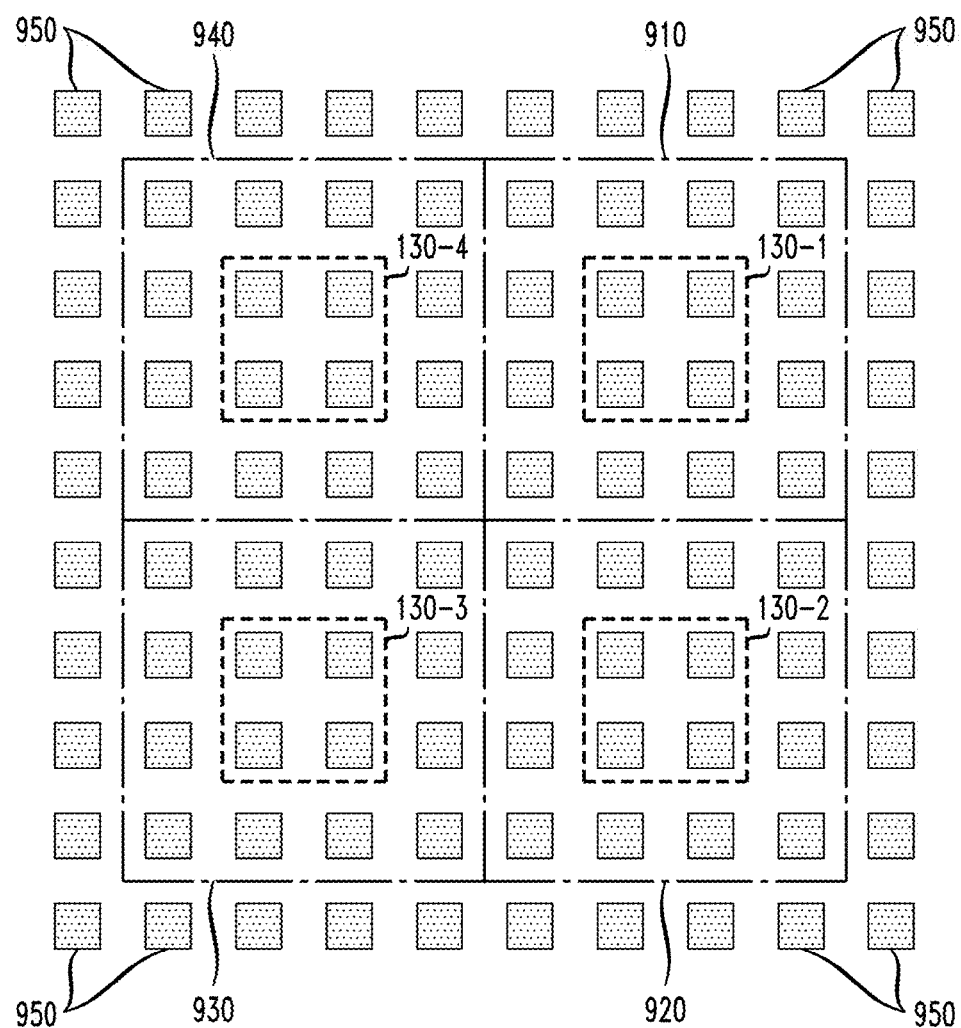
FIG. 9 is a schematic plan view of phased array antenna configuration which can be implemented in a wireless communications package according to an embodiment of the invention.

FIG. 9 is a schematic plan view of phased array antenna configuration which can be implemented in a wireless communications package according to an embodiment of the invention. In particular, FIG. 9 schematically illustrates a phased array antenna configuration 900 comprising a plurality of active patch antenna elements divided into four (4) sub-arrays (or quadrants) 910, 920, 930 and 940 of patch antennas, each sub-array comprising a 4×4 array of patch antennas. The phased array antenna configuration 900 further comprises a plurality of dummy patch elements 950 disposed in an outer perimeter of the array. The dummy patch elements 950 serve to enhance the radiation properties of the active patch elements of the phased array antenna configuration 900, as is understood by one of ordinary skill in the art.

As further shown in FIG. 9, in one embodiment of the invention, a plurality of RFIC chips 130-1, 130-2, 130-3, and 130-4 (shown in phantom as dashed lines) can be implemented in a wireless communications package, wherein each RFIC chip 130-1, 130-2, 130-3, and 130-4 controls operation of the respective sub-arrays of patch antenna elements 910, 920, 930 and 940. In this embodiment, the RFIC chips 130-1, 130-2, 130-3, and 130-4 would be flip-chip bonded to a package carrier (e.g., carrier 110) and communicate with each other over control lines formed within an interface layer (e.g., interface layer 830, FIG. 8) to coordinate operation of the phased array antenna system 900. FIG. 9 is merely an example embodiment of a phased array antenna configuration which can be implemented using wireless communications package structures according to embodiments of the invention. One of ordinary skill in the art can readily envision various other types of phased array antenna configurations that can be implemented using wireless communications package structures as discussed herein.

Those of ordinary skill in the art will readily appreciate the various advantages associated with integrated chip/antenna package structures according to embodiments of the invention. For instance, the package structure can be readily fabricated using known manufacturing and packaging techniques to fabricate and package antenna structures with semiconductor RFIC chips to form compact integrated radio/wireless communications systems that are configured to operate at millimeter-wave frequencies and higher. Moreover, integrated chip packages according to embodiments of the invention enable antennas to be integrally packaged with IC chips such as transceiver chips, which provide compact designs with very low loss between the transceiver and the antenna. Various types of antenna designs can be implemented including patch antennas, slot antennas, slot ring antennas, dipole antennas, and cavity antennas, for example. Moreover, the use of integrated antenna/IC chip packages according to embodiments of the invention as discussed herein saves significant space, size, cost, and weight, which is a premium for virtually any commercial or military application.

Although embodiments have been described herein with reference to the accompanying drawings for purposes of illustration, it is to be understood that embodiments of the invention are not limited to those precise embodiments, and that various other changes and modifications may be affected herein by one skilled in the art without departing from the scope of the invention.

We claim:

1. An antenna package, comprising:
    a package carrier comprising an antenna ground plane and an antenna feed line; and
    a package cover comprising a planar lid, the planar lid comprising a planar antenna element formed on a first surface of the planar lid;
    wherein the package cover is bonded to a first surface of the package carrier with the first surface of the planar lid facing the first surface of the package carrier, and with the planar antenna element on the first surface of the planar lid aligned to the antenna ground plane and the antenna feed line of the package carrier;
    wherein the package cover is bonded to the package carrier with the first surface of the planar lid fixedly disposed at a distance from the first surface of the package carrier to provide an air space between the planar antenna element and the first surface of the package carrier; and
    wherein the package cover comprises a rectangular frame structure that is bonded to the planar lid using a first array of solder bump connections, and wherein the rectangular frame structure is bonded to the first surface of the package carrier using a second array of solder hump connections.

2. The antenna package of claim 1, wherein the antenna ground plane comprises a slot formed therein, wherein the slot is aligned to the planar antenna element and to a portion of the antenna feed line, wherein the slot is configured to couple electromagnetic energy between the planar antenna element and the antenna feed line.

3. The antenna package of claim 1, wherein the antenna ground plane is disposed on the first surface of the package carrier.

4. The antenna package of claim 1, wherein a portion of the antenna feed line is disposed on the first surface of the package carrier.

5. The antenna package of claim 1, wherein the planar lid comprises an array of patch antenna elements formed on the first surface of the package lid.

6. The antenna package of claim 1, further comprising one or more support structures disposed in the air space between the first surfaces of the planar lid and package carrier to support the planar lid.

7. The antenna package of claim 1, further comprising a metallization pattern formed on a second surface of the planar lid, opposite the first surface of the planar lid, wherein the metallization pattern is configured to provide structural support to the planar lid.

8. The antenna package of claim 1, wherein each antenna ground plane comprises a slot formed therein, wherein the slot is aligned to a corresponding planar antenna element and to end portions of the first and second antenna feed lines associated with the corresponding planar antenna element, wherein the slot is configured to couple electromagnetic energy between the planar antenna element and the end portion of the first antenna feed line.

9. The antenna package of claim 8, wherein the antenna ground plane is disposed within the package carrier between the end portions of the first and second antenna feed lines.

10. The antenna package of claim 9, wherein the end portion of the second antenna feed line is disposed on the first surface of the package carrier.

11. A wireless communications package comprising:
an antenna package, comprising:
  a package carrier comprising an antenna ground plane and an antenna feed line; and
  a package cover comprising a planar lid, the planar lid comprising a planar antenna element formed on a first surface of the planar lid;
  wherein the package cover is bonded to a first surface of the package carrier with the first surface of the planar lid facing the first surface of the package carrier, and with the planar antenna element on the first surface of the planar lid aligned to the antenna ground plane and the antenna feed line of the package carrier;
  wherein the package cover is bonded to the package carrier with the first surface of the planar lid fixedly disposed at a distance from the first surface of the package carrier to provide an air space between the planar antenna element and the first surface of the package carrier; and
  wherein the package cover comprises a rectangular frame structure that is bonded to the planar lid using a first array of solder bump connections, and wherein the rectangular frame structure is bonded to the first surface of the package carrier using a second array of solder bump connections; and
an RFIC (radio frequency integrated circuit) chip flip-chip bonded to a second surface of the package carrier opposite the first surface of the package carrier.

12. The wireless communications package of claim 11, further comprising an application board bonded to the second surface of the package carrier.

13. The wireless communications package of claim 11, further comprising one or more support structures disposed in the air space between the first surfaces of the planar lid and package carrier to support the planar lid.

14. The wireless communications package of claim 11, further comprising a metallization pattern formed on a second surface of the planar lid, opposite the first surface of the planar lid, wherein the metallization pattern is configured to provide structural support to the planar lid.

15. An antenna package, comprising:
  a package carrier comprising a plurality of antenna ground planes, and a plurality of antenna feed lines; and
  a package cover comprising a planar lid, wherein the planar lid comprises a planar antenna array patterned on a first surface of the planar lid, wherein the planar antenna array comprises an array of planar antenna elements;
  wherein the package cover is bonded to a first surface of the package carrier with the first surface of the planar lid facing the first surface of the package carrier, wherein each planar antenna element on the first surface of the planar lid is aligned to a corresponding one of the antenna ground planes and a corresponding one of the antenna feed lines;
  wherein each antenna feed line comprises a first antenna feed line and a second antenna feed line, wherein the first and second antenna feed lines enable a dual polarization mode of operation of the planar antenna elements; and
  wherein the package cover is bonded to the package carrier with the first surface of the planar lid fixedly disposed at a distance from the first surface of the package carrier to provide an air space between the planar antenna array and the first surface of the package carrier.

16. The antenna package of claim 15, wherein the package cover comprises a sidewall structure disposed around a peripheral region of the first surface of the planar lid, wherein the sidewall structure is bonded to the first surface of the package carrier.

17. The antenna package of claim 16, wherein the package cover is bonded to the first surface of the package carrier using an array of solder bump connections between the sidewall structure and the package carrier.

18. The antenna package of claim 16, wherein the package cover is bonded to the first surface of the package carrier using an adhesive material between the sidewall structure and the package carrier.

19. The antenna package of claim 15, wherein the first surface of the planar lid is bonded to the first surface of the package carrier using a ball grid array of solder connections.

20. The antenna package of claim 15, wherein the package cover comprises a rectangular frame structure that is bonded to the planar lid using a first array of solder bump connections, and wherein the rectangular frame structure is bonded to the first surface of the package carrier using a second array of solder bump connections.

* * * * *